United States Patent
Kadlec et al.

(10) Patent No.: US 9,355,824 B2
(45) Date of Patent: May 31, 2016

(54) ARC SUPPRESSION AND PULSING IN HIGH POWER IMPULSE MAGNETRON SPUTTERING (HIPIMS)

(75) Inventors: Stanislav Kadlec, Prague (CZ); Jürgen Weichart, Balzers (LI)

(73) Assignee: EVATEC AG, Trubbach (CH)

( * ) Notice: Subject to any disclaimer, the term of this patent is extended or adjusted under 35 U.S.C. 154(b) by 1716 days.

(21) Appl. No.: 11/954,507

(22) Filed: Dec. 12, 2007

(65) Prior Publication Data

US 2008/0135400 A1 Jun. 12, 2008

Related U.S. Application Data

(60) Provisional application No. 60/869,566, filed on Dec. 12, 2006, provisional application No. 60/869,578, filed on Dec. 12, 2006, provisional application No. 60/869,912, filed on Dec. 14, 2006.

(51) Int. Cl.
*H01J 37/34* (2006.01)
*H01J 37/32* (2006.01)
(Continued)

(52) U.S. Cl.
CPC ......... *H01J 37/3444* (2013.01); *C23C 14/3485* (2013.01); *C23C 14/35* (2013.01); *H01J 37/32944* (2013.01); *H01J 37/3408* (2013.01); *H01J 37/3467* (2013.01)

(58) Field of Classification Search
CPC .............. H01J 37/3444; H01J 37/3408; H01J 37/32944; H01J 37/3467; C23C 14/3485; C23C 14/35

USPC ......................................... 204/298.03, 298.08
See application file for complete search history.

(56) References Cited

U.S. PATENT DOCUMENTS 5,241,152 A * 8/1993 Anderson et al. ......... 219/121.57
5,993,613 A * 11/1999 Manley .................... 204/192.12
(Continued)

FOREIGN PATENT DOCUMENTS

EP 1434336 A1 6/2004
WO 0237529 A2 5/2002
(Continued)

OTHER PUBLICATIONS

International Search Report for PCT/EP2007/063787 dated Nov. 14, 2008.
Written Opinion dated for PCT/EP2007/063787 Nov. 14, 2008.
(Continued)

*Primary Examiner* — Michael Band
(74) *Attorney, Agent, or Firm* — Pearne & Gordon LLP

(57) ABSTRACT

An apparatus for generating sputtering of a target to produce a coating on a substrate is provided. The apparatus comprises a magnetron including a cathode and an anode. A power supply is operably connected to the magnetron and at least one capacitor is operably connected to the power supply. The apparatus also includes an inductance operably connected to the at least one capacitor. A first switch and a second switch are also provided. The first switch operably connects the power supply to the magnetron to charge the magnetron and the first switch is configured to charge the magnetron according to a first pulse. The second switch is operably connected to discharge the magnetron. The second switch is configured to discharge the magnetron according to a second pulse.

16 Claims, 10 Drawing Sheets

(51) Int. Cl.
*C23C 14/35* (2006.01)
*C23C 14/34* (2006.01)

(56) References Cited

U.S. PATENT DOCUMENTS

2004/0124077 A1* 7/2004 Christie .................. 204/192.12
2008/0135401 A1* 6/2008 Kadlec et al. ............ 204/192.13

FOREIGN PATENT DOCUMENTS

WO 2005010228 A2 2/2005
WO 2006049566 A1 5/2006

OTHER PUBLICATIONS

Kouznetsov, V et al., "A Novel Pulsed Magnetron Sputter Technique Utilizing Very High Target Power Densities", Surface and Coatings Technology, Jan. 1, 1999, 290-293, vol. 122, Elsevier, Amsterdam, NL.

Helmersson et al., "Ionized Physical Vapor Deposition (IPVD): A Review of Technology and Applications", Thin Solid Films, Aug. 14, 2006, 1-24, vol. 513, Elsevier-Sequoia, Lausanne, CH.

* cited by examiner

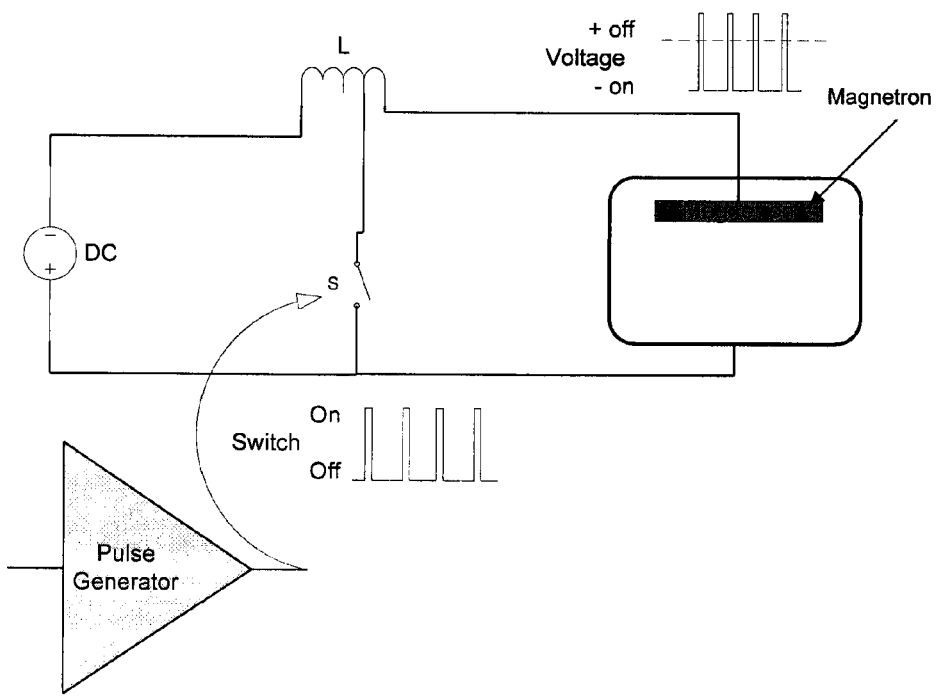
FIG. 1 (prior art – Chopper principle)
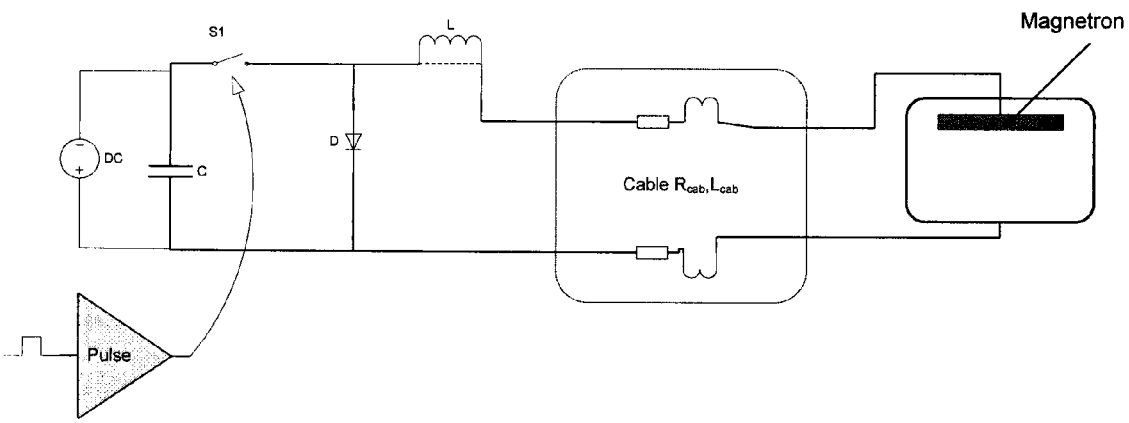
FIG. 2 (prior art - HIPIMS)

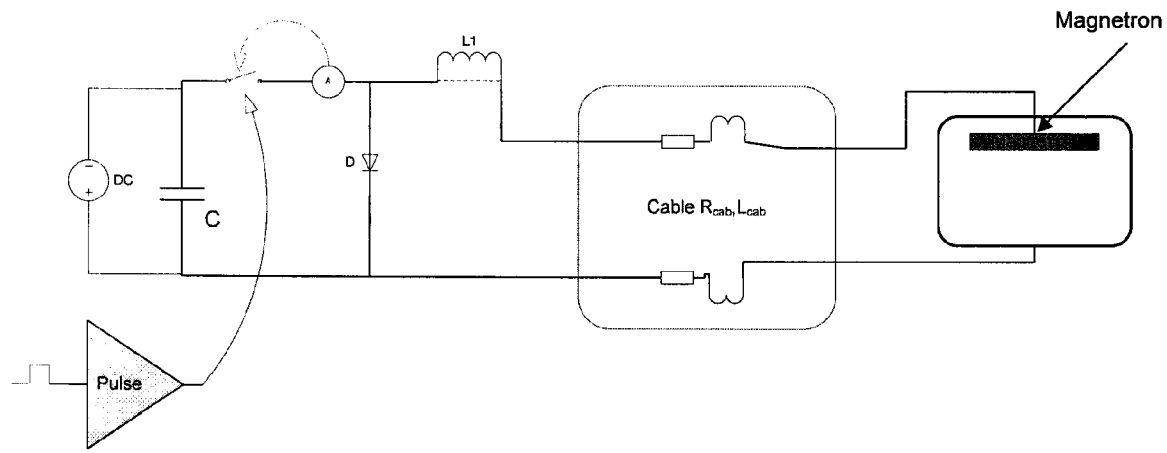
FIG. 3 (prior art) HIPIMS with arc suppression
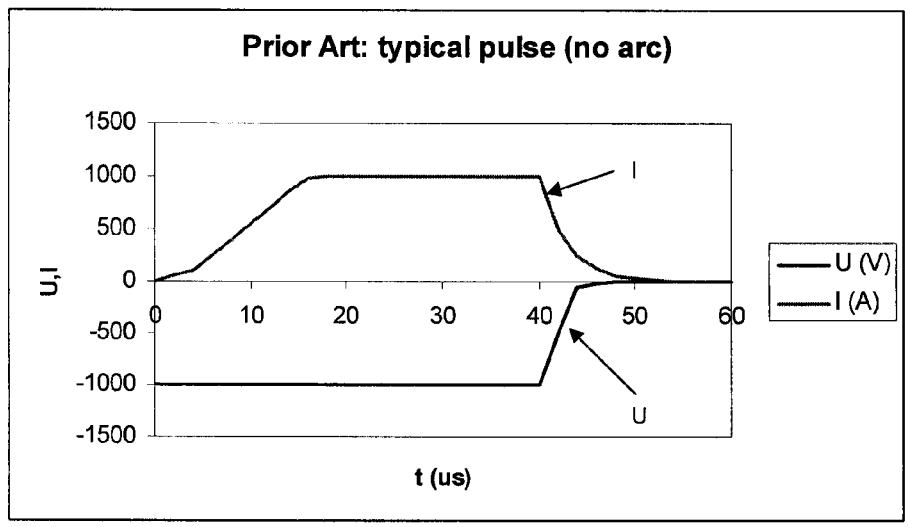
FIG. 4 (prior art)

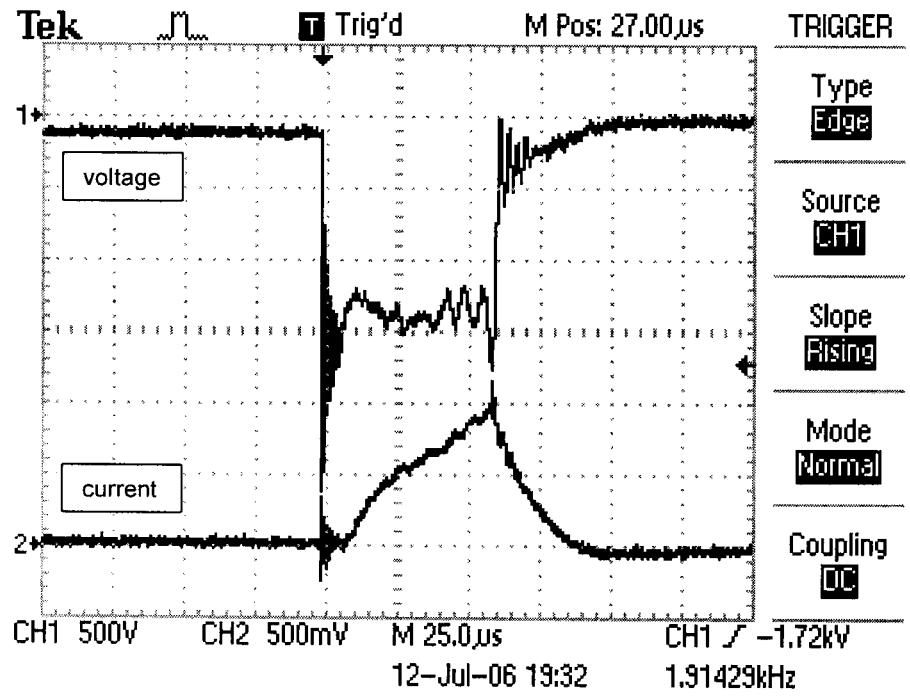
FIG. 11 (Experiment 1: HIPIMS with Ti target)
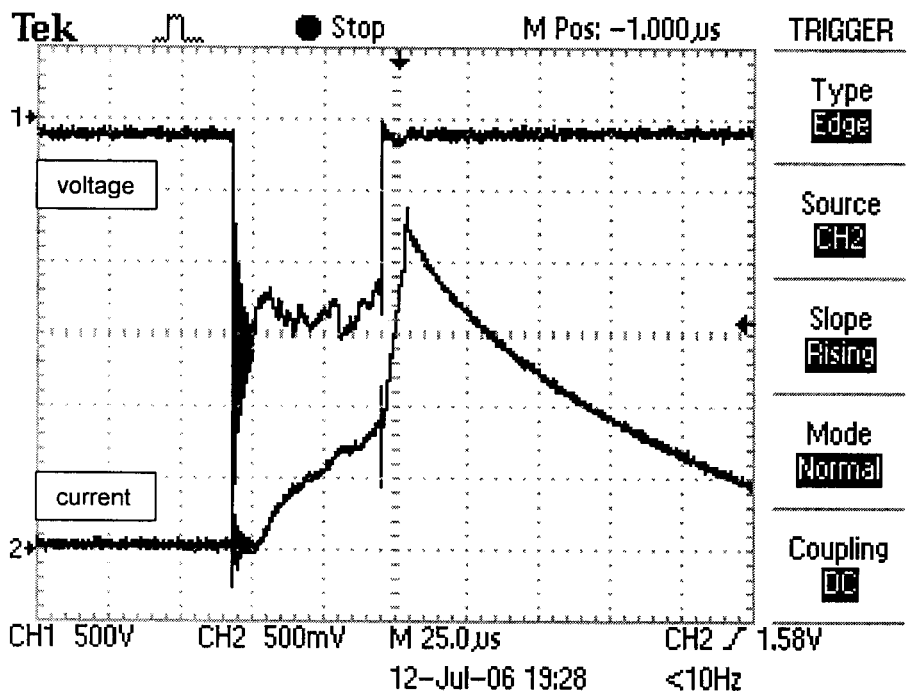
FIG. 12 (Experiment 2: HIPMS with Ta target)

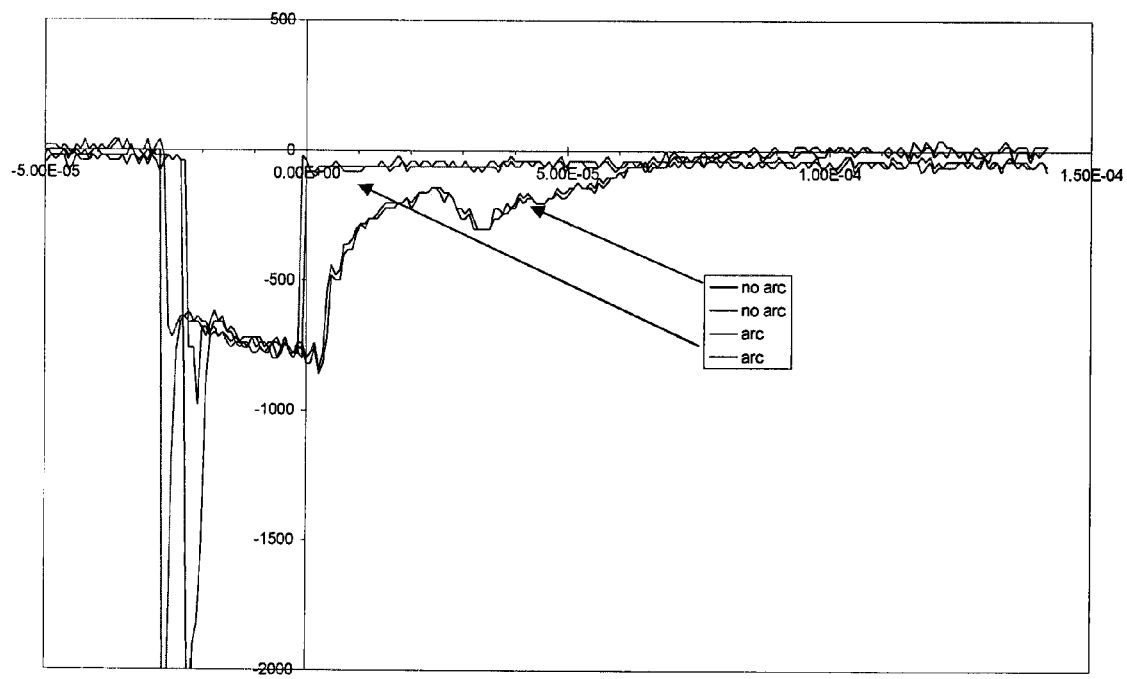
FIG. 13 - Voltage with and without arc
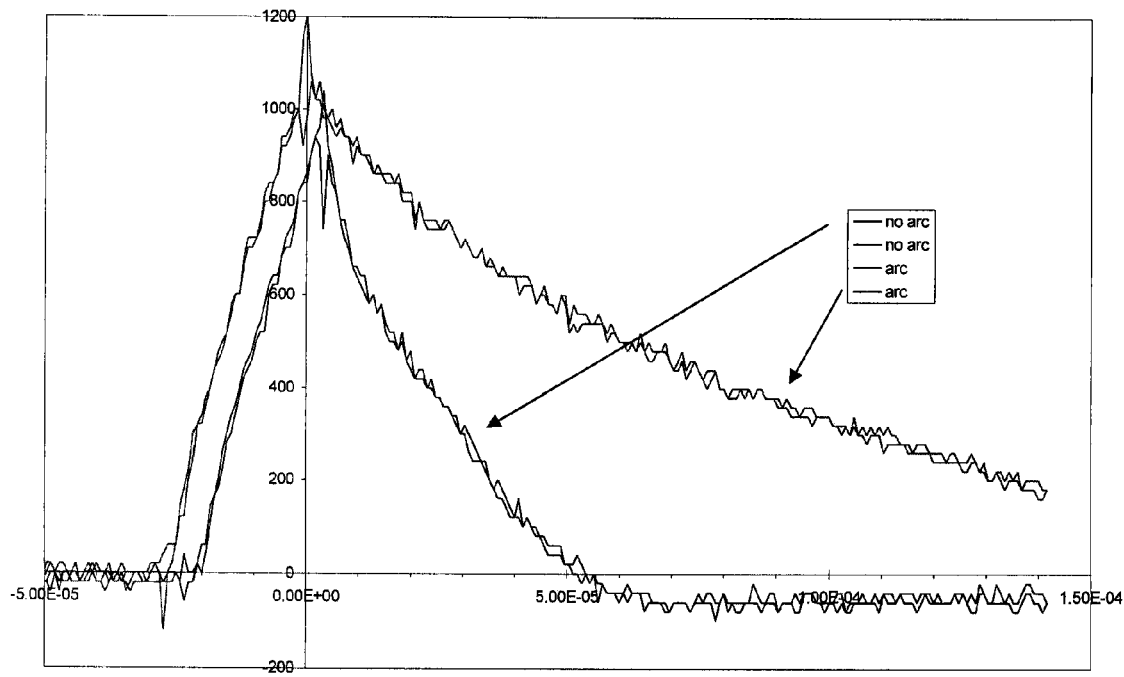
FIG. 14 - Current with and without arc:

ARC SUPPRESSION AND PULSING IN HIGH POWER IMPULSE MAGNETRON SPUTTERING (HIPIMS)

CROSS-REFERENCE TO RELATED APPLICATIONS

This application claims the benefit of U.S. Provisional Application No. 60/869,566, filed Dec. 12, 2006, the entire disclosure of which is hereby incorporated herein by reference. This application also claims the benefit of U.S. Provisional Application No. 60/869,578, filed Dec. 12, 2006, the entire disclosure of which is hereby incorporated herein by reference. This application also claims the benefit of U.S. Provisional Application No. 60/869,912, filed Dec. 14, 2006, the entire disclosure of which is hereby incorporated herein by reference.

BACKGROUND OF THE INVENTION

The present invention relates generally to generating sputtering to produce a coating on a substrate, more particularly, to high power impulse magnetron sputtering (HIPIMS).

Sputtering is a physical process whereby atoms in a solid target material are ejected into the gas phase due to bombardment of the material by energetic ions. The process of sputtering is commonly used for thin-film deposition. The energetic ions for the sputtering process are supplied by a plasma that is induced in the sputtering equipment. In practice, a variety of techniques are used to modify the plasma properties, especially ion density, to achieve the optimum sputtering conditions. Some of the techniques that are used to modify the plasma properties include the usage of RF (radio frequency) alternating current, an AC power source, a DC power sources, a superposition of DC and AC power sources, a pulsed DC power source such as a bipolar or unipolar power source, the utilization of magnetic fields, and the application of a bias voltage to the target.

Sputtering sources are usually magnetrons that utilize magnetic fields to trap electrons in a closed plasma loop close to the surface of a target. The electrons follow helical paths in a loop around the magnetic field lines. The electrons undergo more ionizing collisions with gaseous neutrals near the target surface than would otherwise occur. The sputter gas is inert, typically argon, though other gases can be used. The extra argon ions created as a result of these collisions leads to a relatively higher deposition rate. It is known to arrange strong permanent magnets beyond the target in order to create such a magnetic field loop. At the location of the plasma loop on the surface of the target, a racetrack can be formed, which is the area of preferred erosion of material. In order to increase material utilization, movable magnetic arrangements are being used, that allow for sweeping the plasma loop over relatively larger areas of the target.

Direct current (DC) magnetron sputtering is a well-known technique using crossed electric and magnetic fields. An enhancement of DC magnetron sputtering is pulsed DC. The technique uses a so-called "chopper," where an inductor coil L and a switch are used to modify a DC power supply into a supply of unipolar or bipolar pulses, see FIG. 1. The inductor coil L is the chopper and can preferably include a tap located between the DC power supply and the magnetron cathode. The electronic switch S is periodically open and closed to create the pulses. In the on-time of the switch S, an effective shortcut between the tap of the coil L and the magnetron anode switches the negative cathode voltage off, preferably overshooting to positive voltages by the auto transforming effect of coil L. During off-time, the current from the DC power supply continues to flow into the coil L and storing energy in its magnetic field. When the switch S is again off, a short negative high voltage peak is formed at the magnetron cathode. This helps for relatively fast reigniting of the magnetron plasma and restoring the original discharge current.

The High Power Impulse Magnetron Sputtering (HIPIMS) technology as described in the prior art uses relatively lower repetition frequency of pulses typically 5 Hz to 200 Hz, and pulse times 20 to 500 µs. The discharge peak currents range from 100 A for relatively small cathodes up to 4 kA for relatively large cathodes, which corresponds to current density at cathode in the order of magnitude of 0.1 to 10 A/cm². A common technique uses wiring as in FIG. 2.

In FIG. 2 and FIG. 3, the DC power supply charges a bank of capacitors C to a starting voltage, that is discharged into the magnetron through a cable with some inductance $L_{cab}$ and resistance $R_{cab}$. Optionally, an inductance L is introduced in series to limit the rise time of the magnetron discharge current. In FIG. 3, an arc is detected by an amp meter. When an arc is occurring during a pulse at the power supply, the capacitor is disconnected and only the energy left in the cable plus optional coil L1 is discharged into the arc discharge.

FIG. 6 shows the result of an experiment. The data shows the measured rise time of the current as a function of frequency in a state of the art HIPIMS discharge. The target in this example was made of Tantalum (Ta), with the target having a diameter of 300 mm, and the experiment was using a rotating magnet array. For low repetition frequency of 10 Hz (100 ms period), there is a relatively long delay (about 5 µs) between the start of the voltage pulse and the start of the current rise. The delay is somewhat shorter (over 4 µs) when a repetition frequency of 100 Hz (10 ms period) is used. With a relatively higher frequency of 500 Hz (2 ms period), the current starts to rise much faster, within only about 1.5 µs.

There are a number of disadvantages with the standard HIPIMS technique. One disadvantage is that relatively large and expensive capacitors dimensioned for high stored energy and for substantially voltage other than the magnetron operation voltage are provided. Another disadvantage is that the magnetron is operated in a mode close to constant voltage, in contrast to operating the magnetron in a constant current mode. One other disadvantage is that there is a long starting time of the magnetron current pulse (5 to 100 µs), as seen in the experiment of FIG. 6. Another disadvantage is that there is a long delay between the voltage pulse and the start of the current rise (2 to 20 µs).

Using a chopper is a good choice when relatively high duty cycles (50% to 99% on-time), short off-times (100 ns-10 µs) and high frequencies (10-500 kHz) are used. A duty cycle is equivalent to the percentage of an on-time divided by the cycle time. Under such circumstances, the energy losses in the coil stay acceptable and the coil size is not too large. However, HIPIMS uses relatively low frequencies (5 Hz to 200 Hz), and low duty cycles of 0.01% to 10%. This is not favorable for chopper operation, as a full peak discharge current should flow through the coil over the long plasma off period, causing high resistive losses in the coil. Also the coil dimensions for the enormous stored energy are not practical.

The prior art literature of Helmersson, Christie, and Vlček show that one of the major drawbacks of HIPIMS is a relatively lower deposition rate per average input power. The reason for the lower deposition rate is that the sputtered material can be relatively highly ionized in a well developed HIPIMS discharge and the ions are attracted back to the cathode and therefore most of them do not reach the substrate.

The high discharge current values used in HIPIMS also create an increased risk of arcing. It is well known that when an arc occurs, the discharge voltage drops down to the range 10-100V, the current increases, and the discharge itself contracts to one or more tiny hot cathode spots. Arcs are undesirable because the energy in the system discharges too rapidly. Damage done by such hot spots to the surface of the target has been described as well as emission of droplets and particles. Some power supplies that have been used for HIPIMS use arc suppression capability. A common technique for arc suppression uses the wiring scheme of FIG. 3.

The occurrence of arcing is shown by the plots in FIG. 4 and FIG. 5. FIG. 4 shows a typical HIPIMS pulse without arc occurrence, whereas FIG. 5 is an example of an arc event. When the arc occurs, the discharge impedance decreases drastically. This results in a sharp increase of current, but the increase is limited in amplitude and rise by the serial impedance of $L_{cab}$, L1 and $R_{cab}$. When the arc is detected by one of the well-known techniques, e.g. by exceeding a threshold current, the switch S1 is immediately set to an off-state, only with a delay limited by the used electronics and the switching element. Nevertheless, the energy E stored in the cable and the coil may be relatively large. If the peak current before switch-off is $I_{peak}$ and effective inductance $L=L_{eab}+L1$, the energy $E=L\ I_{peak}^2/2$. As an example, $I_{peak}=2$ kA and $L=1.0$ μH gives energy E=2 J. This is an energy that is able to deliver for example arc current of 200 A at arc voltage 50V for a period as long as 200 μs.

In technological processes using HIPIMS for deposition of decorative or hard coating the standard arc suppression described above may be enough to prevent or limit target damage and enable reasonable quality deposition, especially when pulsing conditions are carefully chosen to prevent or limit frequent arcing and to inhibit the formation of arcs. Nevertheless, for processes sensitive to particles, such as semiconductor wafer processing, thin film heads, MEMS, and optical or magnetic data storage, the residual energy fed into an arc may be too large. Droplets emitted from arcs during deposition may cause malfunction of some devices being produced on a silicon wafer or another substrate. An even worse problem can be the accumulation of particles in the processing chamber, for example after installing a new target. Such new targets often exhibit a much larger tendency to arcing than older, sputter-eroded targets. Particles accumulated in this way may be released from the reactor walls later during production processes, even if arcing during the process itself does not occur.

The standard techniques used for arc suppression have a disadvantage of leaving too much energy available for an arc discharge after the arc suppression electronics reacted. This energy in the order of magnitude of 0.1 to 10 Joule is enough for heating up the cathode spot, developing a full arc discharge and emitting droplets on most technically interesting target materials. It is desirable to limit the arc energy and lifetime of the arc after it is detected.

BRIEF SUMMARY OF THE INVENTION

The following presents a simplified summary of the invention in order to provide a basic understanding of some example aspects of the invention. This summary is not an extensive overview of the invention. Moreover, this summary is not intended to identify critical elements of the invention nor delineate the scope of the invention. The sole purpose of the summary is to present some concepts of the invention in simplified form as a prelude to the more detailed description that is presented later.

In accordance with one aspect of the present invention, an apparatus for generating sputtering of a target to produce a coating on a substrate is provided. The apparatus comprises a magnetron including a cathode and an anode. A power supply is operably connected to the magnetron and at least one capacitor is operably connected to the power supply. The apparatus also includes an inductance operably connected to the at least one capacitor. A first switch and a second switch are also provided. The first switch operably connects the power supply to the magnetron to charge the magnetron and the first switch is configured to charge the magnetron according to a first pulse. The second switch is operably connected to discharge the magnetron. The second switch is configured to discharge the magnetron according to a second pulse.

In accordance with another aspect of the present invention, an apparatus for generating sputtering of a target to produce a coating on a substrate is provided. The apparatus comprises a magnetron including a cathode and an anode. A power supply is operably connected to the magnetron and at least one capacitor is operably connected to the power supply. At least one detector is operably connected to the magnetron where the at least one detector is configured for detecting that an arc is forming. A first switch and a second switch are also provided. The first switch operably connects the power supply to the magnetron to charge the magnetron and the first switch is configured to charge the magnetron according to a first pulse. The second switch is operably connected to discharge the magnetron and the second switch is configured to discharge the magnetron and inhibit the formation of an arc upon a detection of an arc forming by the at least one detector.

In accordance with another aspect of the present invention, an apparatus for generating sputtering of a target to produce a coating on a substrate is provided. The apparatus comprises a magnetron including a cathode and an anode. A power supply is operably connected to the magnetron and at least one capacitor is operably connected to the power supply. The apparatus also includes an inductance operably connected to the at least one capacitor. A first switch and a second switch are also provided. The first switch operably connects the power supply to the magnetron to charge the magnetron and the first switch is configured to charge the magnetron according to a first pulse. The second switch is operably connected to discharge the magnetron. The second switch is configured to discharge the magnetron according to a second pulse. At least one detector is operably connected to the magnetron where the at least one detector is configured for detecting that an arc is forming. A detection of the arc activates the second switch to inhibit the formation of the arc.

In accordance with another aspect of the present invention, an apparatus for generating sputtering of a target to produce a coating on a substrate is provided. The apparatus comprises a magnetron including a cathode and an anode. A power supply is operably connected to the magnetron and at least one capacitor is operably connected to the power supply. The apparatus also includes a coil operably connected to the at least one capacitor. A first switch and a second switch are also provided. The first switch operably connects the power supply to the magnetron to charge the magnetron and the first switch is configured to charge the magnetron according to a first pulse. The second switch is operably connected to discharge the magnetron and is connected at a point along the coil. The second switch is configured to discharge the magnetron according to a second pulse. At least one detector is operably connected to the magnetron where the at least one detector is configured for detecting that an arc is forming. A detection of the arc activates the second switch to inhibit the formation of the arc. The first switch and the second switch are controlled in response to a detection of the arc by the at least one detector to inhibit a formation of the arc.

In accordance with another aspect of the present invention, a method of administering voltage pulses to an apparatus that generates sputtering to produce a coating on a substrate is provided. The method includes the step of applying a first pulse to a first switch to charge a magnetron from a power supply. The method also includes the step of applying a second pulse to a second switch to discharge the magnetron.

BRIEF DESCRIPTION OF THE SEVERAL VIEWS OF THE DRAWINGS

The foregoing and other aspects of the present invention will become apparent to those skilled in the art to which the present invention relates upon reading the following description with reference to the accompanying drawings, in which:

FIG. 1 is a prior art schematic of a chopper principle;

FIG. 2 is a prior art schematic of a HIPIMS application;

FIG. 3 is a prior art schematic of a HIPIMS application with arc suppression;

FIG. 4 is a plot illustrating the voltage and amps of an HIPIMS application in the prior art during a typical pulse;

FIG. 11 is a plot illustrating an experiment using a Titanium (Ti) target;

FIG. 12 is a plot illustrating an experiment using a Tantalum (Ta) target;

FIG. 13 is a plot illustrating an experiment and the effect of arcs on the voltage;

FIG. 14 is a plot illustrating an experiment and the effect of arcs on the current;

DETAILED DESCRIPTION OF THE INVENTION

Figure 5:
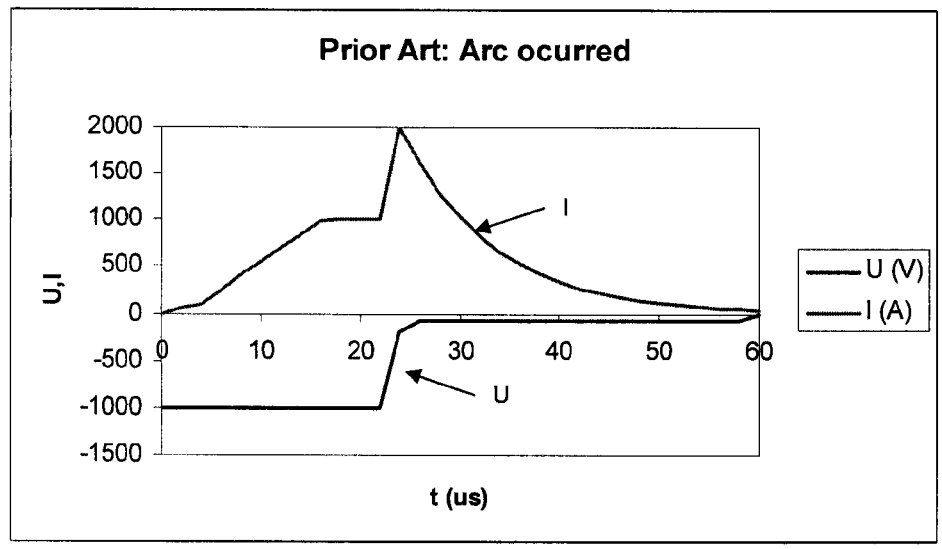
FIG. 5 is a plot illustrating the voltage and amps of an HIPIMS application in the prior art during a typical pulse when an arc is taking place.

Examples that incorporate one or more aspects of the present invention are described and illustrated in the drawings. These illustrated examples are not intended to be a limitation on the present invention. For example, one or more aspects of the present invention can be utilized in other embodiments and even other types of devices. Moreover, certain terminology is used herein for convenience only and is not to be taken as a limitation on the present invention. Still further, in the drawings, the same reference numerals are employed for designating the same elements.

Figure 6:
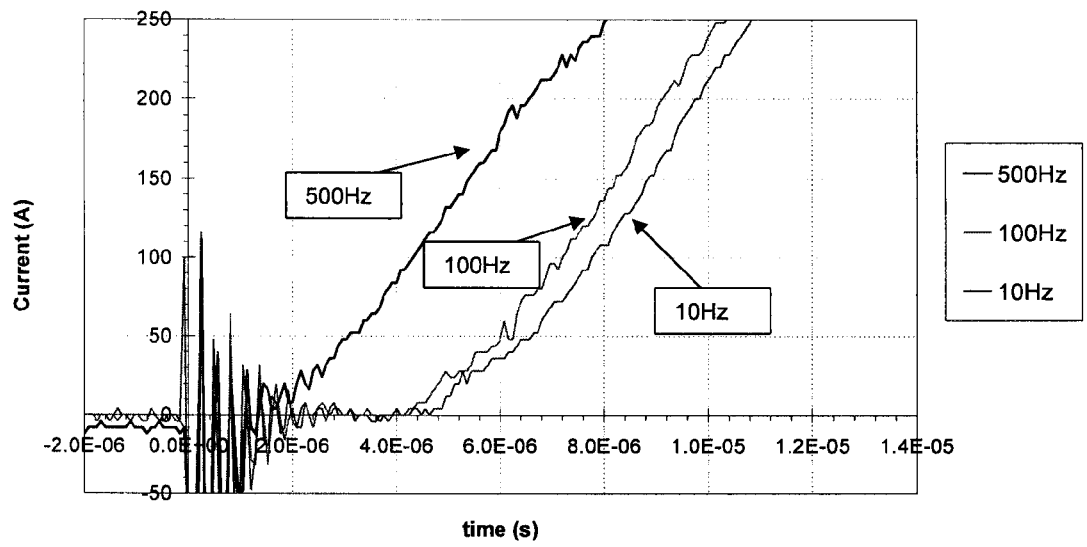
FIG. 6 is a plot illustrating different frequencies and the measured rise in current as a function of time.
Figure 7:
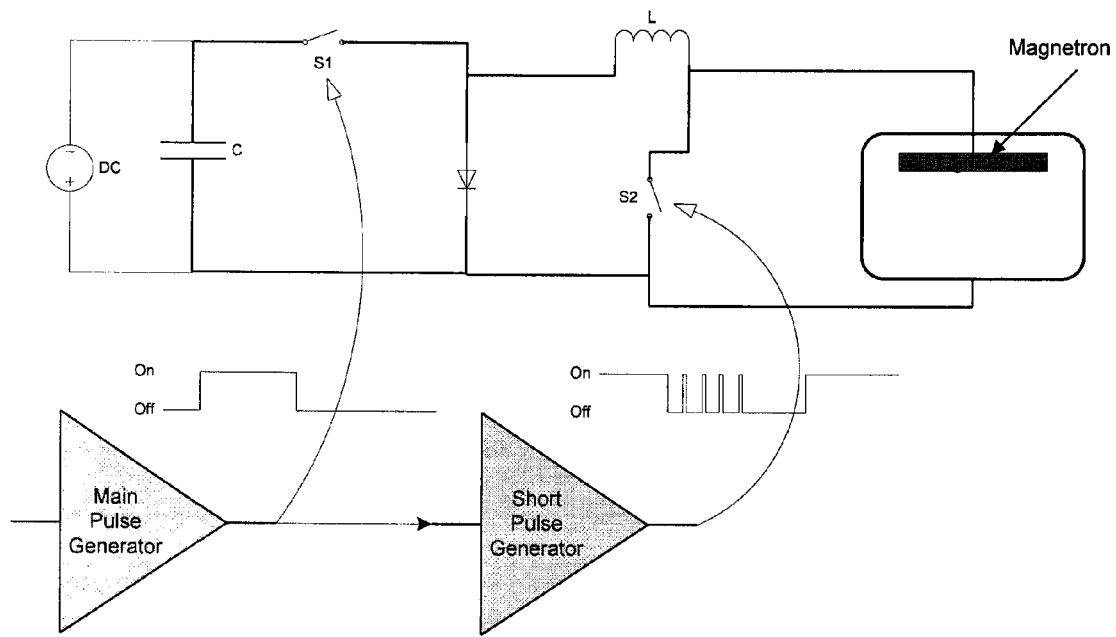
FIG. 7 is a first example schematic of the subject invention with two switches for applying different modes.

In HIPIMS it is not commonly known to use fast switching with on-times below 10 µs. The example of FIG. 7 is designed based on measurements made at low frequencies (1 to 200 Hz) showing high rise times of current in µs, limiting shortest pulse on-times to about 10 µs and thus the maximum frequency to about 1 kHz, based on a duty cycle of 1%. The experiment in FIG. 6 showed a clear tendency to the possibility of a relatively fast switching of the high power magnetron discharge when the rest plasma density remains relatively high enough. Based on experiments with DC pulsed sputtering and choppers in the frequency range 20 to 500 kHz, plasma can re-ignite within 0.2 µs and the limit of frequency does not necessarily apply. On the contrary, different physical phenomena are expected when the pulse on- and off-times are comparable with the time of the flight of ions through the sheath and pre-sheath (0.2 µs to 5 µs).

The example of the subject invention of FIG. 7 includes a first switch S1 and a second switch S2 in this design. The first switch S1 is operably connected to charge the magnetron and is configured to administer a first voltage and can charge the magnetron according to a first pulse. The second switch S2 is operably connected to discharge the magnetron and can be configured to discharge the magnetron according to a second pulse. An inductance is also provided in this example and is operably connected to the at least one capacitor. The inductance in this example is a coil L though it is appreciated that other structures can be used to provide the inductance. The coil L has a similar functionality during HIPIMS operation as coil L1 in FIG. 2 of the prior art. Thus, the coil L in FIG. 7 also limits the slope of the magnetron discharge current rise. The coil L also limits the peak current when an arc occurs. The example apparatus of FIG. 7 also can include a magnetron including a cathode and an anode, a target located near the magnetron and used for sputtering atoms to produce the coating on the substrate, a power supply operably connected to the magnetron, and at least one capacitor C operably connected to the power supply. The coil L is operably connected to the at least one capacitor C. The power supply can be a DC power supply. The example apparatus of FIG. 7 can apply HIPIMS pulsing at a current density on the cathode of the magnetron between 0.1 and 10 A/ cm$^2$.

Figure 8:
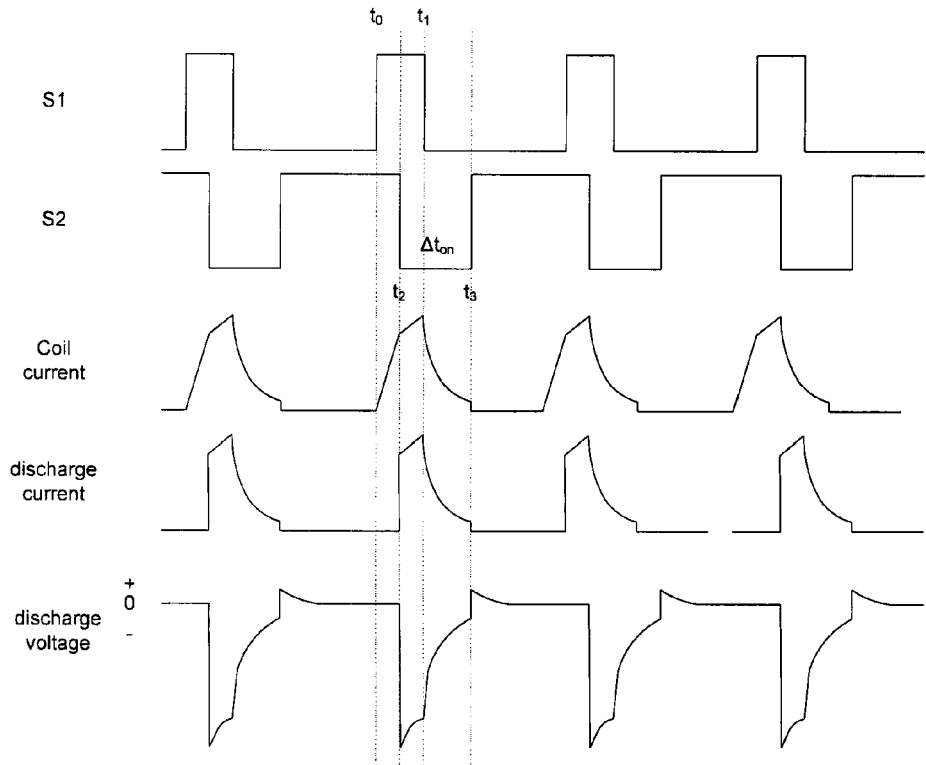
FIG. 8 is an example schematic of a high frequency mode for use with FIG. 7.

There are several modes of operation using the example of FIG. 7 using increased pulse frequency to increase the efficiency of the HIPIMS system. In one mode of operation for the example of FIG. 7, shown in FIG. 8, the pulse form for the first switch S1, the first pulse, has a high frequency. Example pulse shapes for the first pulse of the first switch S1 and the second pulse of the second switch S2 are shown in the schematic of FIG. 8 for this high frequency mode. The high frequency mode of FIG. 8 can be operated at different levels, including a high frequency pulsed operation of 200 Hz-100 kHz, with preferable examples occurring between 1 kHz to 20 kHz. A relatively low effective duty cycle (0.1% to 10%) with lower power losses can also be achieved in this mode. An on-time (time period of $t_1-t_0$) of 0.2 µs to 100 µs can be used in this example, with preferable examples occurring from 2 µs to 40 µs. The current density can be an area-average.

The high frequency mode can start with connecting the charged capacitor C to the coil L at time $t_0$. It is appreciated that the charged capacitor can be at least one capacitor and the drawings can refer to a plurality of capacitors. Activating the switch S2 to be opened at time $t_2$ ignites the plasma, after a delay of time ($t_2-t_0$). The energy stored in the coil L can result in a voltage overshoot that occurs almost immediately on the magnetron cathode and in a relatively faster rise time of the magnetron current, as shown in the example of FIG. 8. The magnetron discharge current decays between time $t_1$ (S1 changes to off) and $t_3$ (S2 changes to on). The time $t_3$ can be chosen between short times after $t_1$ to relatively long times, including the rest of the period. Each first pulse in the example mode of FIG. 8 starts with the voltage overshoot and the relatively fast rise of current during the same initial time period of ($t_2 - t_0$). The energy effectiveness is reached by a relatively long off-time for the first switch S1 that is used for charging the capacitor C. This time period is shown by the period before $t_0$ occurs. The initial time period ($t_2 - t_0$) is relatively short and is used to store energy in the coil L. The relatively short time elapses when the first switch S1 is activated to store energy in the coil L before the second pulse activates the second switch S2. The opening of the second switch S2 causes a discharging of the magnetron. From a time $t_0$ to $t_1$ the charge of the capacitor C loads the coil L and there between discharging of the current of the magnetron starts to take place. Specifically, the magnetron discharge takes place from a time $t_2$ to $t_1$. From a time $t_1$ to $t_3$ the rest energy from the coil L is discharged into the magnetron.

Figure 9:
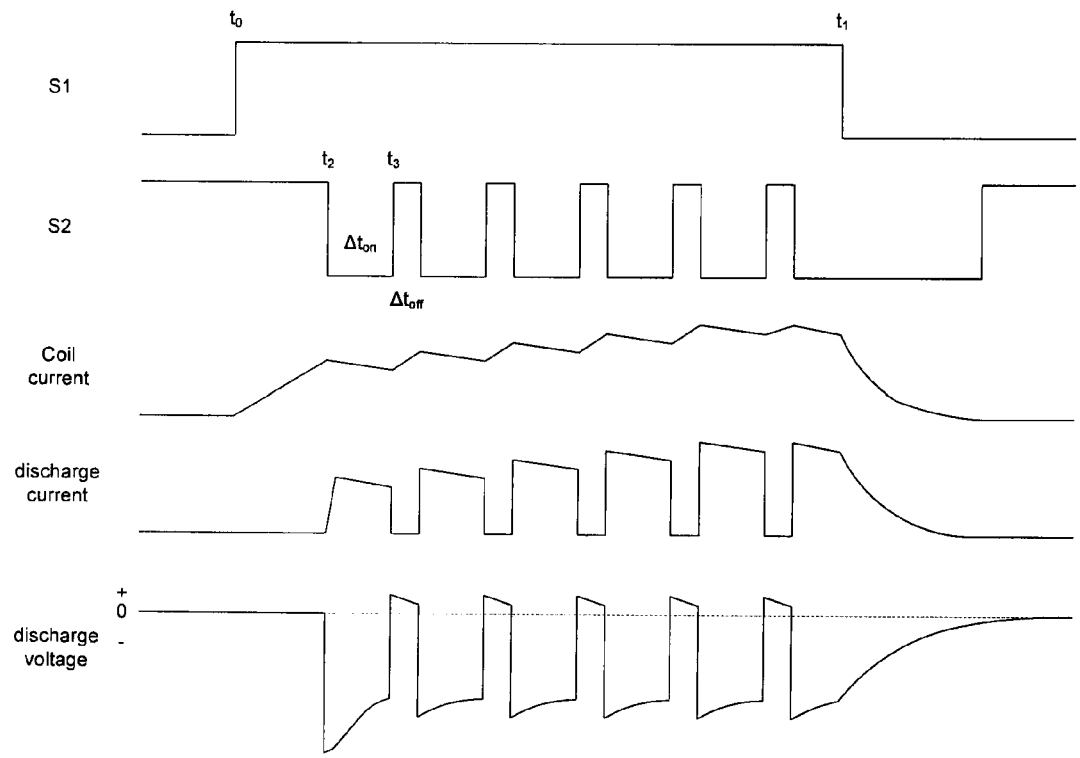
FIG. 9 is an example schematic of a multiple sub-pulse mode within a first pulse that is used with FIG. 7.

A second mode of operation for the example of FIG. 7 is shown in FIG. 9. In this mode, the second pulse exerts multiple sub-pulses that are formed within one main HIPIMS pulse of the first pulse. The first pulse can be a single, relatively long pulse to administer a voltage to the magnetron, and the first pulse is formed by using the first switch S1, during the time period $t_1-t_0$. The second pulse can be a multiple of sub-pulses, or a series of shorter sub-pulses, that are then formed at switch S2, as shown in the example of the mode in FIG. 9. The mode of FIG. 9 can be operated at different levels, including a main frequency of 1 Hz-10 kHz, with preferable examples occurring between 10 Hz to 1 kHz. The first pulse has a duty cycle (0.1% to 10%) can be used in this mode. In this mode, an on-time (time period of $t_1-t_0$) of 0.2 µs to 100 µs, preferably 2 µs to 20 µs can be used. The second pulse on-time (time period of $t_3-t_2$, which is equal to $\Delta t_{on}$) can be 0.2 µs to 100 µs, with preferable examples of 2 µs to 20 µs. Similarly, the second pulse off-time (time period of $\Delta t_{off}$) can be 0.2 µs to 100 µs, with preferable examples of 2 µs to 20 µs. Many examples of the mode are present, as the second pulse duty cycle can have a wide range of values. For example, the second pulse duty cycle ($\Delta t_{on}$)/($\Delta t_{on}+\Delta t_{off}$) can range from 30% to 99%. It is thus appreciated that many different types of pulse configurations can be devised involving different types of constant and varied time periods for the second pulses. For example, even the $\Delta t_{on}$ can have different amounts of time during each second pulse within a single main HIPIMS pulse of S1.

During operation of the second mode example of FIG. 9, the time period $t_1-t_0$ is used to charge the capacitor C, load the coil L, and discharge the current of the magnetron. The second pulse, or rather the first sub-pulse, can start with a proper delay when the switch S2 opens. During the time $t_0-t_2$, the charge of the capacitor C loads the coil L only. The energy stored in the coil L results in a voltage overshoot on the magnetron cathode and in a relatively faster rise time of the magnetron current. The second pulse then can exert a sequence of shorter pulses by switching S2 open and closed. Each of the pulses within the second pulse can start with a voltage overshoot and a relatively fast rise of current. Specifically, the magnetron discharge takes place from a time $t_2-t_3$, each time S2 is turned on. During the time period $t_1-t_3$, the energy from the coil L is discharged into the magnetron. At the end of the sub-pulse series of the second pulse, the magnetron discharge current decays after time $t_1$, when switch S1 is turned off, until the rest of the energy stored in the coil L is discharged. During the off time of switch S1 before $t_0$, the capacitors C are being charged and the plasma density decays without any energy input.

Figure 10:
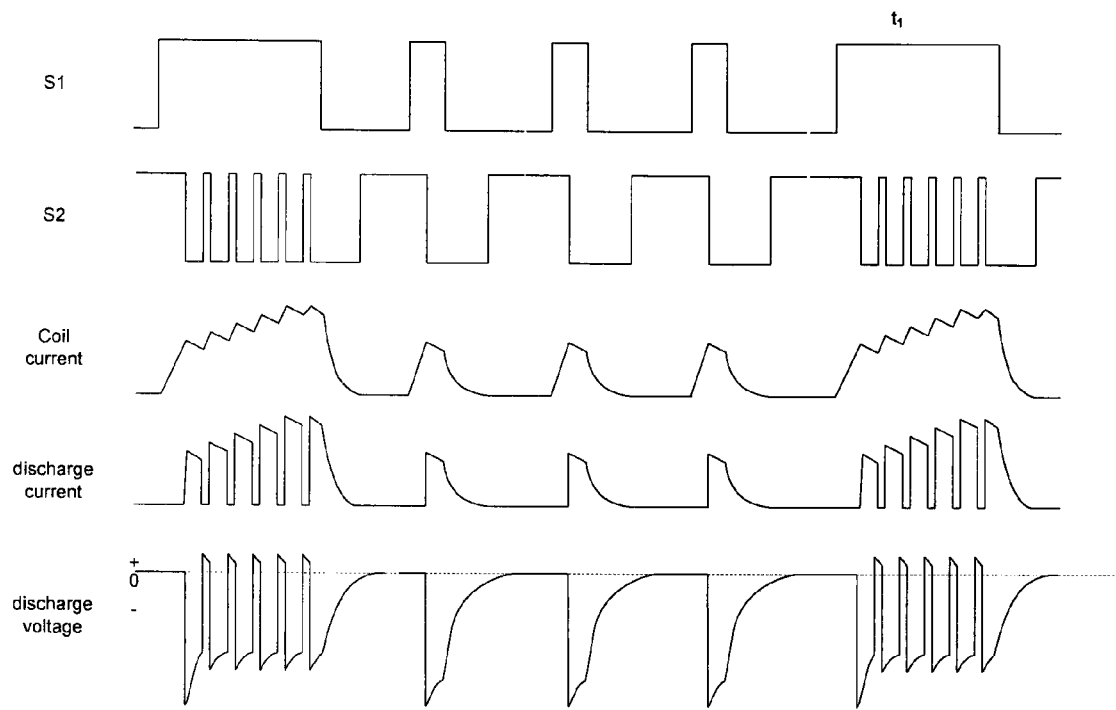
FIG. 10 is an example schematic of a pulsed pre-ionization mode for use with FIG. 7.

A third mode of operation of FIG. 7 is shown in FIG. 10. This mode can be referred to as a pulsed pre-ionization mode. This mode is an alternating sequence of the first mode of FIG. 8 with the second mode of FIG. 9 in that multiple sub-pulses of the second pulse are formed within a first pulse, according to the mode of FIG. 8, being the main HIPIMS pulse. This way, there are pulses similar to the first mode within the second pulse that can be used during the first pulse of the switch S1 to ensure that the decay of plasma density is not too rapid by still keeping the average discharge power low. Thus, this example mode can be viewed as combining elements of the first two example modes. In the example of FIG. 10 in the S1 graph, the first long pulse corresponds to a pulse according to the second mode of operation, while the three subsequent pulses refer to the first mode, the "high frequency" mode of operation (see FIG. 8). The rate between the two modes can be chosen according to the technical needs. Thus, in one example, the first pulse and the second pulse can periodically change between the first mode (FIG. 8) and the second mode (FIG. 9). The mode of FIG. 10 can be characterized accordingly by the frequency of the second mode ("main frequency") alternating with the properties of first mode, as previously described. The main frequency of a first pulse in either mode can be 1 Hz-10 kHz, with preferable examples occurring between 10 Hz to 1 kHz. In one mode, an on-time (time period of $t_1-t_0$) of 0.2 µs to 100 µs, preferably 2 µs to 20 µs can be used. The sub-pulse on-time of the second pulse during the first pulse off-time can be 0.2 µs to 10 µs with preferable examples between 1 µs to 5 µs. The duty cycle of the first pulse can be between 0.1% and 10% in this mode. Many examples of either mode are present, as the sub-pulse duty cycle of the second pulse during the first switch S1 off-time can have a wide range of values. For example, the sub-pulse duty cycle for the second pulse during the off-time ($\Delta t_{on}$)/($\Delta t_{on}+\Delta t_{off}$) can range from 0.01% to 20%. Moreover, other types of pulses can be used within the second pulse that are different than the elements in the first example mode.

Either of the examples of FIG. 8-10 can be used as a method of administering voltage pulses to an apparatus that generates sputtering to produce a coating on a substrate. In the example method, a first pulse is applied to a first switch to charge a magnetron from a power supply. The example method also includes the step of applying a second pulse to a second switch to discharge the magnetron. The first pulse and the second pulse can include the examples of FIGS. 8-10 in this example method.

One example of FIG. 7 can be designed where the coil, $$L = \left| U \left( \frac{dI}{dt} \right)^{-1} \right|.$$

For every 1 kV, there can be a charge of 1 kA/1 µs, where the L equals 1 µH in one example. The coil L can be in the range of 0.1 to 100 µH.

One example of FIG. 7 can be designed where the capacitor, $$C = \left| i \left( \frac{dU}{dt} \right)^{-1} \right|.$$

In the high frequency mode, for every 1 kA, there is a discharging of 10V/1 µs. The capacitor C can be equal to 1 µF.

Despite the technical complication of implementing additional electronics with high-voltage, high-current, relatively fast switches, as in the first example of FIG. 7, the generator of the subject invention itself can be relatively smaller, cheaper and faster. When the time delay between the pulses is shorter, the energy delivered for charging the capacitors between the pulses is relatively smaller and the capacitors can have a lower capacity, which results in smaller dimensions and lower cost. The transforming effects of the coil L allow the use of a relatively lower voltage in the power supply. Thus, the cost of the power supply can be reduced. Moreover, the smaller capacitors allow less of a delay of the regulating feedback loop.

Each of these advantages contribute to reliable, repeatable, arc-free processes that are key features for short processing (200 ms to 10 min) of substrates sensitive to particles, such as the processing of semiconductor wafers, thin film heads, MEMS, optical data storage, magnetic data storage media, or flat panel displays. Other advantages of the subject invention are related to the beneficial effects of the chopper off-time when the chopper switch S2 turns on. During this time period, the target voltage switches to positive values. Some electrons from the plasma end on the target and the plasma potential reach positive values. The ions that were present in the sheath, pre-sheath, and in the plasma, are now accelerated from the target towards the substrates and the walls. The effect for a single pulse depends on the pulse off-time and the target voltage. The final effect depends in part on the repetition frequency. The effect depends also on the point of contact of the switch S2 along the coil L. This point of contact can be called the tap. The more windings that are present between the magnetron end of the coil L and the tap result in a higher voltage transformation effect, a higher positive voltage on target during off-time, and in higher ion energy and relatively faster depletion of the ions from the near-target region.

The first example of the subject invention can be used with a sputtering device using a power supply, such as with the example of FIG. 7. The method of film deposition of the first example using this power supply and switching method using any of the modes can be used for the metallization of a trench and a via in front-end semiconductor wafer processing. The method can be also used for general metallization, wetting or seed layers in deep vias in silicon, for through/wafer vias. For example, the second pulse and the position of the second switch along the inductor coil can be both adjusted to provide a desired coating for the substrate, as well as for forming one or more layers on the substrate. Examples of additional layers can be a wetting layer or a seed layer. The method can also be used for optimizing the bottom and/or sidewall coverage in the trenches and/or vias by chopper off-time and/or position of the coil tap. In another example, the method can be used to optimize the ion flux to the substrate by adjusting the chopper off-time and/or the position of the coil tap. The deposition rate can also be optimized by an adjustment of the second pulse off-time (i.e. the chopper off-time) and/or adjusting the position of the second switch along an inductor coil. Thus, different and relatively higher deposition rates can be obtained that are desirable for many applications. Using a coil with more switchable tabs, such as a coil where the point of contact with the switch S2 can be adjusted, or changing the coil L helps to find an optimum level for the apparatus. Such effects can be used to optimize the ion flux to the substrate as well as the ion energy. The bottom and sidewall coverage of trenches and vias in semiconductor wafers or other structures on substrates can be optimized as well. Furthermore, the method of the first example can be used to optimize a film stress, a microstructure, a mechanical property, an electrical property, an optical property, and other properties of the coating by the adjustment of the second pulse (i.e. the chopper off-time) and/or the adjustment of the position of the coil tap, such as adjustment of the second switch along an inductor coil.

The abovementioned drawback of a relatively lower specific rate in HIPIMS applications compared to DC magnetron sputtering can be partly compensated by the pulsing method of the subject invention. When the duration of the chopper on-time is comparable with the ion flight time across the target sheath and pre-sheath (in a range of approximately 0.2 µs to 5 µs), it is possible to limit a substantial part of the ionized sputtered particles from being pulled back to the target. The particles can be inhibited from being pulled back to the target by the chopper off time producing a reversed direction of electric field and acceleration before the ions reach the target.

FIGS. 11-14 include a number of experimental results that help to illustrate the benefits of early arc detection. FIG. 11 is a plot illustrating an experiment using a Titanium (Ti) target. This experiment shows a voltage of a Titanium target and a current of the target as an arc occurs. FIG. 12 is a plot illustrating an experiment using a Tantalum (Ta) target. This experiment shows a voltage of a Tantalum target and a current of the target as an arc occurs. FIG. 13 is a plot illustrating an experiment and the effect of arcs on the voltage. FIG. 14 is a plot illustrating an experiment and the effect of arcs on the current. This plot illustrates how the current remains at a larger value for a longer period of time when an arc occurs.

Figure 15:
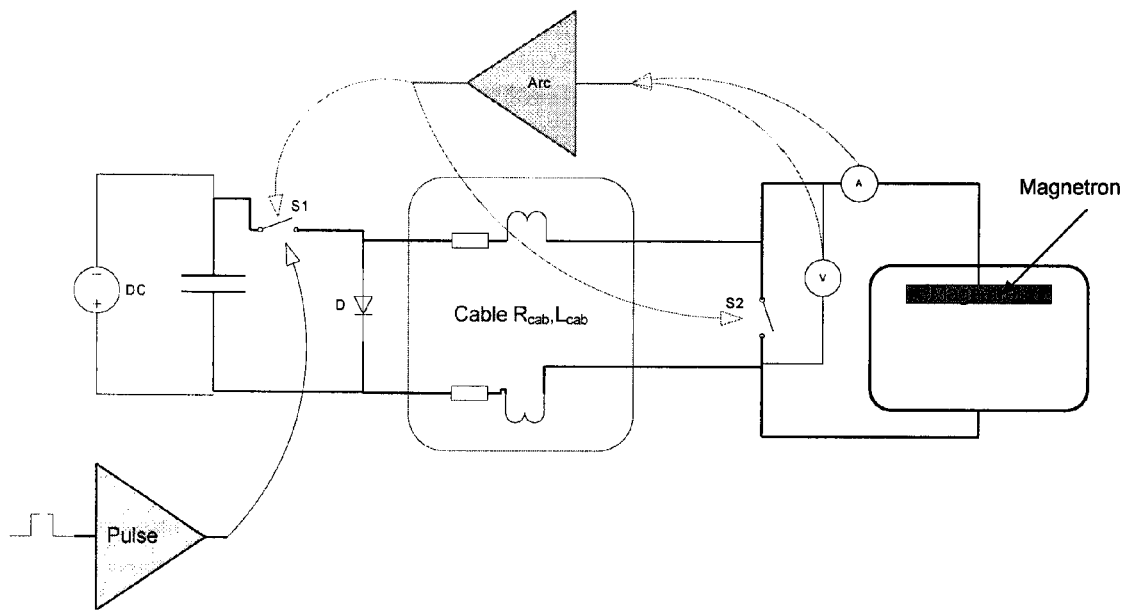
FIG. 15 is a second example schematic of the subject invention with two switches and arc detection.

A second example of the subject invention, using arc detection, is shown in FIG. 15. The basic idea is to prevent or inhibit the formation of an arc at a location close to the cathode of the magnetron after an arc is detected as forming or beginning to form. The example of FIG. 15 includes at least one detector. The detector can be a meter such as a voltage meter (V) or an amp meter (A). In other examples, the detector can be one device that can monitor amps, volts, or a plurality of indicators to detect that an arc is forming. In the example of FIG. 15, two detectors, a voltage meter (V) and an amp meter (A) are placed in close proximity to the magnetron and are operably connected to the magnetron. The voltage meter (V) and the amp meter (A) are configured for detecting that an arc is forming. It is appreciated that in other examples, only one detector is provided, and in other examples, further detectors can be provided in various locations, including locations in close proximity to the magnetron. When one detector is provided, it can be either a voltage meter or an amp meter that is configured to detect that an arc is forming or beginning to form. The example of FIG. 15 also can include a magnetron including a cathode and an anode, a target located near the magnetron and used for sputtering atoms to produce the coating on the substrate, a power supply operably connected to the magnetron, at least one capacitor C operably connected to the power supply, and a first switch S1 operably connected to charge the magnetron and configured to charge the magnetron according to a first pulse. The power supply can be a DC power supply.

Figure 16:
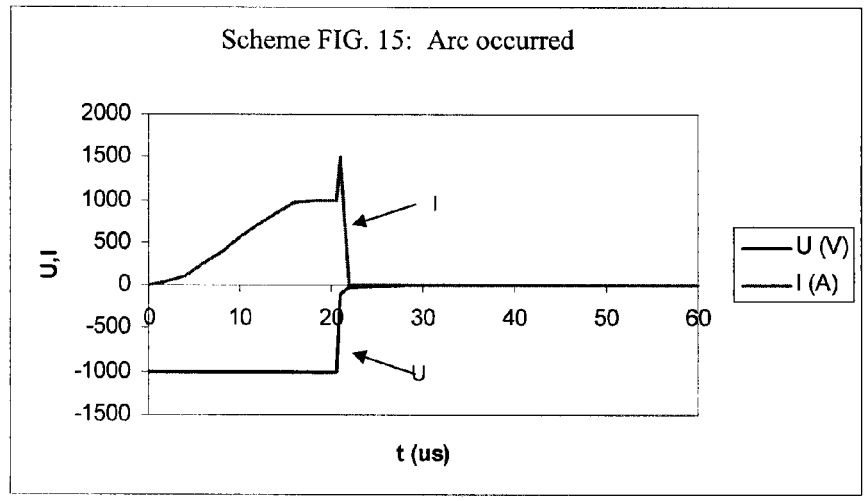
FIG. 16 is a plot illustrating the voltage and current in the system of FIG. 15 after switching occurs when an arc is detected by the system.

A second switch S2 is placed close to the cathode of the magnetron in the example of FIG. 15. The switch S2 is normally open and allows for a pulsing operation. When an arc is detected, the switch S2 switches on and makes an effective shortcut between the magnetron cathode and anode. At the same time that the switch S2 makes a shortcut, the switch S1 can switch off. Alternatively, when the switch S2 is turned on to make a shortcut for the energy; the switch S1 can turn on at a short time period before or after switch S2 is activated. The effect of the switching is shown in FIG. 16. Thus, the first switch S1 can also be controlled in response to the detection of an arc forming by at least one detector. The switch S1 can be controlled to inhibit or limit the formation of the arc. Controlling the first switch in addition to the second switch provides additional control of the energy in the apparatus. Inductance can also be provided in this example. The inductance can be a coil L can also be used with FIG. 15, the arc detection example, where the coil is operably connected to the at least one capacitor C and the coil is configured to limit a rise time of a magnetron discharge current and to limit a peak current when an arc occurs.

Figure 17:
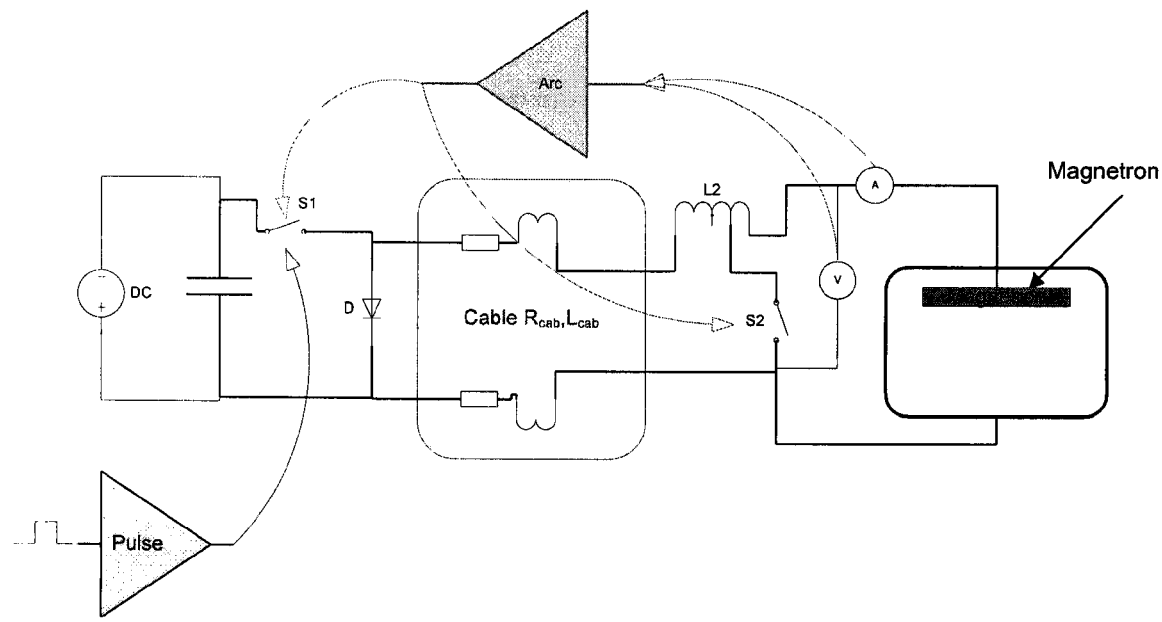
FIG. 17 is another second example schematic of the subject invention with two switches and an arc detection design.
Figure 18:
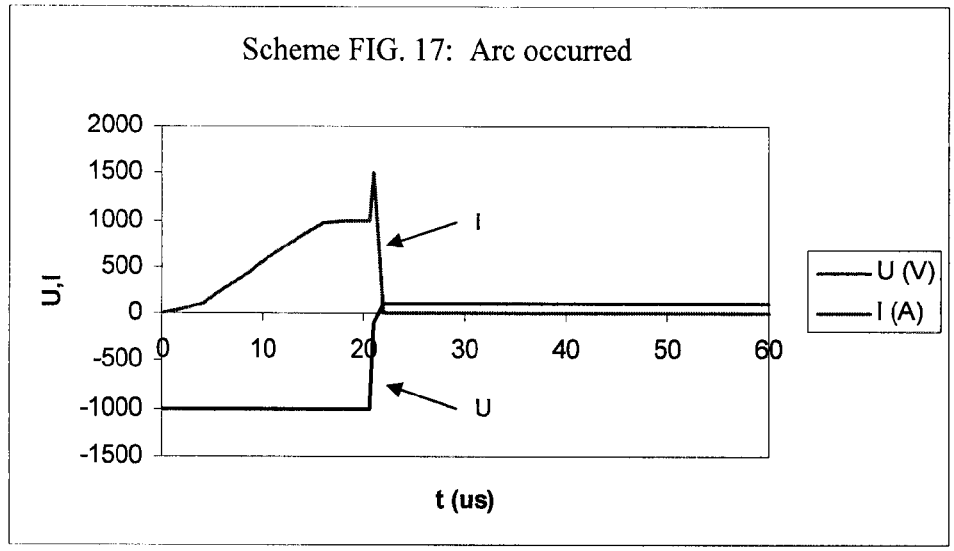
FIG. 18 is a plot illustrating the voltage and current in the system of FIG. 17 after switching occurs when an arc is detected by the system.

Another example of an arc detection apparatus is shown in FIG. 17 which uses an inductance in addition to the scheme shown in FIG. 15. The inductance in this example is the coil L2, though other examples can be used to provide the inductance. The coil L2 has a similar functionality during HIPIMS operation as a coil L1 of the prior art FIG. 3, i.e. to limit the rise time of the magnetron discharge current. The coil L2, in FIG. 17, also limits the peak current when an arc occurs. Thus, this example further includes a coil operably connected to the at least one capacitor C and configured to limit a rise time of a magnetron discharge current and to limit a peak current when an arc occurs. As shown in FIG. 15, the second switch S2 can be operably connected at a point along the coil. After the arc is detected, preferably directly at the cathode to minimize the time delay, the switch S2 switches on and makes an effective shortcut between the point along the coil where the switch S2 is connected and the magnetron anode. This results in an even shorter time at which the voltage on the magnetron cathode is zero, followed by positive voltage by the auto transforming effect of coil L2. The shortcut helps to extinguish the arc relatively faster. The effect of the switching in response to the detection of an arc is shown in FIG. 18. The second switch S2 is located at a position close to the cathode to react quickly to the detection of an arc.

Figure 19:
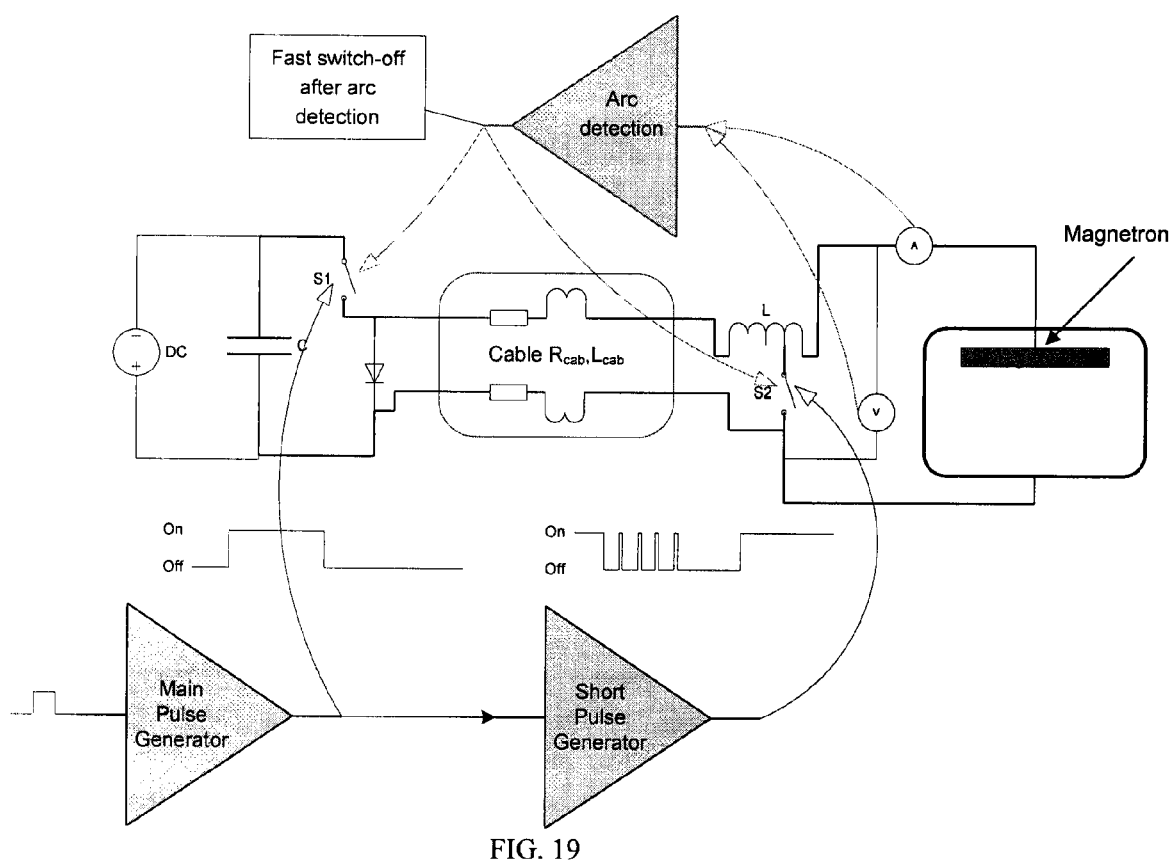
FIG. 19 is a third example schematic of the subject invention with two switches for applying different modes and an arc detection design.

A combination of the first example and the second example of the subject invention is shown in a third example, shown in FIG. 19. FIG. 19 is similar with respect to FIG. 7, but includes some differences in its design. For example, FIG. 19 combines the energy stored in a capacitor C with the beneficial effects of a coil L. As shown, the switch S2 can be connected at a point along the coil L to produce a chopper effect. Two switches S1 and S2 are used in this design. Switch S1 opens the capacitor bank to the coil L and S2 is used as the chopper switch. The coil L has a similar functionality during HIPIMS operation as coil L1 in FIG. 2 of the prior art. Thus, the coil L in FIG. 19 also limits the slope of the magnetron discharge current rise. The coil L also limits the peak current when an arc occurs. The example of FIG. 19 also can include a magnetron including a cathode and an anode, and a target located near the magnetron and used for sputtering atoms to produce the coating on the substrate. In FIG. 19, the DC power supply charges a bank of capacitors C to a starting voltage. The voltage can be discharged into the magnetron through a cable with some inductance $L_{cab}$ and resistance $R_{cab}$. FIG. 19 further includes an arc detection apparatus that measures the current and voltage, as shown. The arc detection in this example is performed by at least one detector that is operably connected to the magnetron where the magnetron is configured for detecting that an arc is forming. Detection of an arc forming activates the second switch S2 to inhibit the formation of the arc. Thus, the detection reduces the harmful effects of an arc by causing the apparatus to react to the detection of an arc forming, or beginning to form. At the same time that the switch S2 makes an effective shortcut, the switch S1 can switch off. Alternatively, when the switch S2 is turned on to make a shortcut for the energy; the switch S1 can turn on at a short time period before or after switch S2 is activated. Thus, the first switch S1 can also be controlled in response to the detection of an arc by at least one detector. Other examples of arc detection are known in the art and can also be applied to this example. For the chopper and coil, L, of FIG. 19, a discharge voltage of 1 kV is used, where a positive off-time voltage 100V tap is at 10% from the magnetron end. For the capacitor, C, of FIG. 17, for every 1 kA, there is a discharging of 100V/200 µs. The capacitor C can be equal to 50 µF, where the capacitor C is in a range of 0.1 to 100 µF.

The example of FIG. 19 is also configured to provide the pulsing method discussed for FIG. 7, where the first switch S1 charges the magnetron according to a first pulse and the second switch S2 discharges the magnetron according to a second pulse. Any of the three example modes used for FIG. 7 can be used with the two switches of FIG. 19. Having more electronics on the cathode is a technical complication. Nevertheless, a smaller, cheaper and faster generator with lower generator voltage and smaller capacitors is an advantage of the design of FIG. 19.

The invention has been described with reference to the example embodiments described above. Modifications and alterations will occur to others upon a reading and understanding of this specification. Examples embodiments incorporating one or more aspects of the invention are intended to include all such modifications and alterations insofar as they come within the scope of the appended claims.

What is claimed is:

1. An apparatus for generating sputtering of a target to produce a coating on a substrate comprising:
    a magnetron;
    a power supply operably connected to the magnetron;
    at least one capacitor operably connected to the power supply;
    an inductance of 0.1 to 100 µH operably connected to the at least one capacitor wherein the inductance is connected in series with the power supply and the magnetron;
    a first switch operably connecting the power supply to the inductance;
    a first control pulse generator having an output operationally connected to the first switch and configured to control the first switch to administer a first pulse having a duty cycle of 0.1% to 10% to the inductance;
    a second switch operably connected to cause discharge of the magnetron when the second switch is open; and
    a second control pulse generator having an output operationally connected to the second switch and configured to control the second switch to cause the discharge of the magnetron.

2. An apparatus according to claim 1, wherein the inductance is a coil and the second switch is operably connected at a point along the coil.

3. An apparatus according to claim 1, further comprising:
    a cable with an inductance and a resistance connected to discharge a starting voltage of the at least one capacitor into the magnetron.

4. An apparatus according to claim 1, wherein the first pulse and the second pulse have on-times and off-times between 0.2 µs and 5 µs.

5. An apparatus for generating sputtering of a target to produce a coating on a substrate comprising:
a magnetron;
a power supply operably connected to the magnetron;
at least one capacitor operably connected to the power supply;
an inductance of 0.1 to 100 µH operably connected to the at least one capacitor wherein the inductance is connected in series with the power supply and the magnetron;
a first switch operably connecting the power supply to the inductance;
a first control pulse generator having an output operationally connected to the first switch and configured to control the first switch to administer a first pulse having a duty cycle of 0.1% to 10% to the inductance;
at least one detector operably connected to the magnetron wherein the at least one detector is configured for detecting an arc that is forming;
a second switch operably connected to cause discharge of the magnetron when the second switch is open and configured to discharge the magnetron and inhibit a formation of the arc upon a detection of the arc forming by the at least one detector; and
a second control pulse generator having an output operationally connected to the second switch and configured to control the second switch to cause the discharge of the magnetron.

6. An apparatus according to claim 5,
wherein the inductance is configured to limit a rise time of a magnetron discharge current and to limit a peak current when an arc occurs.

7. An apparatus according to claim 6, wherein the inductance is a coil and the second switch is operably connected at a point along the coil.

8. An apparatus according to claim 5, wherein the second switch is located at a position close to the cathode.

9. An apparatus according to claim 5, wherein the first switch is controlled in response to the detection of the arc by the at least one detector.

10. An apparatus for generating sputtering of a target to produce a coating on a substrate comprising:
a magnetron;
a power supply operably connected to the magnetron;
at least one capacitor operably connected to the power supply;
an inductance of 0.1 to 100 µH operably connected to the at least one capacitor wherein the inductance is connected in series with the power supply and the magnetron;
a first switch operably connecting the power supply to the inductance;
a first control pulse generator having an output operationally connected to the first switch and configured to control the first switch to administer a first pulse having a duty cycle of 0.1% to 10% to the inductance;
a second switch operably connected to cause discharge of the magnetron;
a second control pulse generator having an output operationally connected to the second switch and configured to control the second switch to cause the discharge of the magnetron; and
at least one detector operably connected to the magnetron;
wherein the at least one detector is configured for detecting a formation of an arc; and
wherein a detection of the arc activates the second switch to inhibit the formation of the arc.

11. An apparatus according to claim 10, wherein the inductance is a coil and the second switch is operably connected at a point along the coil.

12. An apparatus according to claim 10, further comprising:
a cable with an inductance and a resistance connected to discharge a starting voltage of the at least one capacitor into the magnetron.

13. An apparatus according to claim 10, wherein the first switch is controlled in response to the detection of the arc by the at least one detector.

14. An apparatus for generating sputtering of a target to produce a coating on a substrate comprising:
a magnetron;
a power supply operably connected to the magnetron;
at least one capacitor operably connected to the power supply;
a coil having an inductance of 0.1 to 100 µH operably connected to the at least one capacitor wherein the coil is connected in series with the power supply and the magnetron;
a first switch operably connecting the power supply to the coil;
a first control pulse generator having an output operationally connected to the first switch and configured to control the first switch to administer a first pulse having a duty cycle of 0.1% to 10% to the coil;
a second switch operably connected to cause discharge of the magnetron and connected at a point along the coil;
a second control pulse generator having an output operationally connected to the second switch and configured to control the second switch to cause the discharge of the magnetron; and
at least one detector operably connected to the magnetron wherein the at least one detector is configured for detecting an arc that is forming; and
wherein the first switch and the second switch are controlled in response to a detection of the arc by the at least one detector to inhibit a formation of the arc.

15. The apparatus according to claim 1 wherein the at least one capacitor and inductance are connected in parallel.

16. The apparatus according to claim 1 wherein the second pulse generator is configured to generate a second pulse to control the second switch and the first pulse generator and the second pulse generator are configured such that the first pulse is longer than the second pulse.

* * * * *